United States Patent [19]
Ishikawa

[11] Patent Number: 5,429,994
[45] Date of Patent: Jul. 4, 1995

[54] WIRING FORMING METHOD, WIRING RESTORING METHOD AND WIRING PATTERN CHANGING METHOD

[75] Inventor: Takahide Ishikawa, Itami, Japan

[73] Assignee: Mitsubishi Denki Kabushiki Kaisha, Tokyo, Japan

[21] Appl. No.: 278,338

[22] Filed: Jul. 21, 1994

[30] Foreign Application Priority Data

Jul. 22, 1993 [JP] Japan ................... 5-181237

[51] Int. Cl.⁶ .......................................... H01L 21/02
[52] U.S. Cl. .................... 437/230; 437/245; 437/246; 437/923
[58] Field of Search ............... 437/230, 245, 246, 189, 437/923

[56] References Cited

U.S. PATENT DOCUMENTS

| | | | |
|---|---|---|---|
| 4,574,095 | 3/1986 | Baum et al. | 437/230 |
| 4,701,347 | 10/1987 | Higashi | 437/246 |
| 5,182,230 | 1/1993 | Donelon et al. | 437/245 |
| 5,306,663 | 4/1994 | Morimoto | 437/245 |
| 5,358,907 | 10/1994 | Wong | 437/245 |

FOREIGN PATENT DOCUMENTS

| | | | |
|---|---|---|---|
| 63-116443 | 5/1988 | Japan . | |
| 1230251 | 9/1989 | Japan . | |
| 4179231 | 6/1992 | Japan . | |
| 0206842 | 7/1992 | Japan | 437/230 |
| 0109714 | 4/1993 | Japan | 437/230 |
| 8911553 | 4/1989 | WIPO . | |

OTHER PUBLICATIONS

Harriott et al., "Decomposition of Palladium Acetate Films With A a Microfocused Ion Beam," Applied Physics Letters, vol. 49, No. 24, Dec. 15, 1986, New York, pp. 1661-1662.
Meyer et al., "Metallization of Polytetrafluoroethylene (PTFE)", Extended Abstracts, vol. 90-91, May 6, 1990, Princeton, N.J., U.S., pp. 76-77.
Itoh et al., "MMIC Circuit Optimization Using FIB Techniques", IEEE GaAs IC Symposium, 1991, pp. 323-326.

Primary Examiner—Brian E. Hearn
Assistant Examiner—Trung Dang
Attorney, Agent, or Firm—Leydig, Voit & Mayer

[57] ABSTRACT

In a method of manufacturing a semiconductor device, a metal film including a metal element is formed on a wiring base layer by ion beam assisted CVD, more specifically, by selectively irradiating a region of the wiring base layer with a focused ion beam while blowing an organic metal gas containing the metal element onto the region irradiated by the ion beam. Thereafter, a low-resistance metal layer is formed on the metal film by electroless plating. Therefore, a metal wiring of low resistivity with a predetermined pattern is formed without a photolithographic process using a resist and also without sputtering or selective etching of the metal film. Consequently, manufacturing costs of a semiconductor device are significantly reduced.

13 Claims, 11 Drawing Sheets

WIRING FORMING METHOD, WIRING
RESTORING METHOD AND WIRING PATTERN
CHANGING METHOD

FIELD OF THE INVENTION

The present invention relates to a method of manufacturing a semiconductor device, a method of restoring a wiring pattern, and a method of changing a wiring pattern and, more particularly, to a method of forming a metal wiring with a predetermined pattern without using a mask for patterning a metal layer.

BACKGROUND OF THE INVENTION

FIGS. 5(a)–5(e) are sectional views showing an example of a wiring forming method used in the conventional manufacturing method of a semiconductor device, and FIGS. 6(a)–6(f) are sectional views showing a photolithographic process in the wiring forming method. A semiconductor substrate 1 may comprise any material, such as Si or GaAs, if it is normally used in a semiconductor device. A metal film 2a is formed on the semiconductor substrate 1. A metal wiring 2 (referred to as a wiring hereinafter) with a predetermined pattern is formed by patterning the metal film. A resist mask 3a is used in patterning of the metal film 2a.

In addition, a liquid resist 3a is dropped on the metal film 2a on the semiconductor substrate 1. A liquid resist 3b is spread over the entire surface of the metal film 2a. A resist film 3c is formed by baking the liquid resist in heat treatment. A resist film 3d is formed by exposure of the resist film 3c. A resist mask 3 with a predetermined pattern is formed by developing the exposed resist film 3d with developing solution 13.

FIGS. 7, 8(a)–8(c), 9, 10, 11, and 12 are schematic views showing structures of several processing apparatus, such as a sputtering apparatus or a resist applying apparatus, used in steps of the wiring forming method.

As shown in FIG. 7, a sputtering apparatus 210 comprises a substrate table 211 on which the semiconductor substrate 1 is set, a sputtering source 213 generating sputtering particles 213a toward the surface of the semiconductor substrate 1, and an electron gun 212 emitting, for example, electrons toward the sputtering source 213.

As shown in FIG. 8(a), a resist applying apparatus 220 comprises a wafer carried-in portion 220a located on one end of the apparatus body, a resist applying portion 220b located in the center of the apparatus body, and a baking portion 220c located on the other end of the apparatus body.

As shown in FIG. 8(b), a rotating table 221b on which the semiconductor substrate 1 is set is located at the resist applying portion 220b. Above the rotating table 221b, there is located a nozzle 222b for dropping the liquid resist 3a onto the semiconductor substrate 1 on the rotating table 221b. As shown in FIG. 8(c), at the baking portion 220c, there is provided a heating table 221c for heating the semiconductor substrate 1 disposed thereon. In the resist applying apparatus 220, the semiconductor substrate 1 disposed on the wafer carried-in portion 220a is automatically transported to the resist applying portion 220b and to the baking portion 220c.

A resist exposing apparatus 230 comprises, as shown in FIG. 9, a moving table 234 capable of moving in the vertical and horizontal directions, on which the semiconductor substrate 1 is disposed, a converting lens 233 and an exposure light source 231 located above the moving table 234, and a transfer mask 232 disposed between the converting lens 233 and the exposure light source 231. In this structure, a predetermined exposure pattern can be transferred to the semiconductor substrate 1 on the moving table 234.

A developing apparatus 240 comprises, as shown in FIG. 10, a rotating table 241 for rotating the semiconductor substrate 1 disposed thereon. Above the rotating table 241, there are located a developing solution dropping nozzle 242 for dropping a developing solution onto the semiconductor substrate 1 on the rotating table 241 and a wash water blowing nozzle 243 for blowing wash water onto the semiconductor substrate 1 on the rotating table 241.

An ion milling apparatus 250 includes, as shown in FIG. 11, a vacuum chamber 251 having a gas inlet 251a for introducing a gas, such as argon gas, into the chamber and a gas outlet 251b for evacuating the vacuum chamber 251. The vacuum chamber 251 contains a substrate table 254 on which the semiconductor substrate 1 is disposed. A coil 252 for confining plasma 255 is disposed on the side of the gas inlet 251a of the vacuum chamber 251. An accelerating electrode 253 for accelerating ions is disposed at the plasma confined region opposite the substrate table 254.

An oxygen plasma ashing apparatus 260 includes, as shown in FIG. 12, a vacuum chamber 261 having a gas inlet 261a for introducing oxygen gas into the chamber and a gas outlet 261b for evacuating the chamber 261. The chamber 261 contains a substrate table 264 on which the semiconductor substrate 1 is disposed. High frequency applying electrodes 262 for applying high frequency power to the oxygen gas introduced into the chamber 261 are disposed above the substrate table 254 and connected to a high-frequency power supply 263.

The wiring manufacturing method will be described.

First, as shown in FIG. 5(a), the semiconductor substrate 1 is disposed on the substrate table 211 of the sputtering apparatus 210 shown in FIG. 7. After a predetermined gas atmosphere is produced in the apparatus, the sputtering source 213 is irradiated with electrons from the electron gun 212, whereby sputtering particles 213a come out of the sputtering source 213. As shown in FIG. 5(b), the particles are deposited on the semiconductor substrate 1 to form the metal film 2. In this embodiment, a 500 Å thick Ti film and a 1 μm thick Au film are successively formed.

Then, as shown in FIG. 5(c), the resist mask 3 is formed on the metal film 2. More specifically, when the semiconductor substrate 1 with the metal film 2 is carried in the wafer carried-in portion 220a of the resist applying apparatus 220 shown in FIG. 8, it is automatically transported to the resist applying portion 220b. Then, as shown in FIG. 6(a), when the semiconductor substrate 1 is positioned on the rotating table 221b of the resist applying portion 220b, the liquid resist 3a is dropped from the nozzle 222b onto the metal film 2 of the semiconductor substrate 1. Then, as shown in FIGS. 6(b) and 6(c), the rotating table 221b is rotated to spread the liquid resist 3a over the entire surface of the metal film 2 on the semiconductor substrate 1, and the liquid resist 3b is formed.

When the resist is completely applied, the semiconductor substrate 1 is automatically transported to the baking portion 220c. Then, as shown in FIG. 6(d), when the substrate 1 is positioned on the heating table 221c and heated, the liquid resist 3b spread on the entire surface of the metal film 2 is baked, whereby the solid-state resist film 3c is formed.

Thereafter, the semiconductor substrate 1 is transferred to the exposing apparatus 230 shown in FIG. 9 and disposed on the moving table 234 therein. Then, as shown in FIG. 6(e), a predetermined exposure pattern is transferred to the resist film 3c using the transfer mask 232 having the predetermined pattern.

Then, the semiconductor substrate 1 is moved to the developing apparatus 240 shown in FIG. 10. In the apparatus 240, the exposed resist film 3d is developed. More specifically, as shown in FIG. 6(f), the developing solution is dropped from the nozzle 242 onto the resist film 3d on the semiconductor substrate 1 that is disposed on the rotating table 241 of the developing apparatus 240, and it is spread over the entire surface of the resist film 3d by rotation of the rotating table 241, whereby the resist film 3d is developed and the resist mask 3 with the predetermined pattern is formed. Thereafter, the wash water is sprayed from the nozzle 243 onto the surface of the semiconductor substrate 1 to wash away the developing solution. Thus, the developing operation is finished.

Then, referring to FIG. 5(d), the metal film 2 on the semiconductor substrate 1 is patterned by the ion milling apparatus 250 shown in FIG. 11. In the ion milling apparatus 250, ions extracted from the plasma confined region by the accelerating electrode 253 collide with the semiconductor substrate 1 disposed on the substrate table 254, whereby the metal film 2 on the semiconductor substrate 1 is selectively etched.

Finally, the resist mask 3 is removed by the oxygen plasma ashing apparatus 260 shown in FIG. 12. In the ashing apparatus 260, an oxygen gas plasma is applied to the semiconductor substrate 1 disposed on the substrate table 264 in the chamber 260a, whereby the resist mask 3 on the substrate is oxidized and removed.

Thus, according to the conventional wiring forming method in the manufacturing method of a semiconductor device, many substrate processing steps, i.e., steps of sputtering the metal film, applying the resist, transferring the pattern, selectively etching the metal film, and removing the resist, are necessary, and these steps require lots of processing time and very expensive apparatus. In addition, the mask used when the wiring pattern is transferred to the resist is indispensable. Consequently, as described above, the wiring forming process in the manufacturing method of the semiconductor device is an obstacle to reduction of manufacturing costs of the semiconductor device.

Meanwhile, according to Japanese Published Patent Application No. 63-116443, there is disclosed a method of forming a metal film with a predetermined pattern by focused ion beam (FIB) assisted CVD, more specifically, by blowing an organic metal gas, such as hexacarbonyl metal gas, onto a substrate while irradiating the substrate with focused ion beams. The metal film formed by the FIB assisted CVD, however, contains carbon, a constituent of the organic metal gas. Therefore, the resistivity of the metal film is 5 to 10 times higher than the metal contained in the organic metal gas. Additionally, since the depositing speed of the film is extremely low, a film can not be made thick when considering throughput. Consequently, resistivity of the wiring formed from the metal film is significantly high.

SUMMARY OF THE INVENTION

It is an object of the present invention to provide a method of forming a metal wiring having a low resistivity without photolithographic processing using a resist and also without processing such as sputtering or selective etching of the metal film, whereby manufacturing costs of a semiconductor device are significantly reduced.

It is another object of the present invention to provide a simple method of restoring an already provided wiring layer in an electronic device, that is, a completed semiconductor device, without a photolithographic process using a resist.

It is a further object of the present invention to provide a method of changing a wiring pattern of an already provided wiring layer in an electronic device without a photolithographic process using a resist.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, in a method of forming wiring, a metal film comprising a predetermined metal element is formed on a wiring base layer by ion beam assisted CVD (chemical vapor deposition), more specifically, by selectively irradiating a predetermined region of the wiring base layer with a focused ion beam while blowing an organic metal gas containing the predetermined metal element onto the region irradiated by the ion beam. Thereafter, a low-resistance metal layer is formed on the metal film by electroless plating. Therefore, a metal wiring of low resistivity with a predetermined pattern is formed without a photolithographic process using a resist and also without processing such as sputtering or selective etching of the metal film. Consequently, manufacturing costs of a semiconductor device are significantly reduced. As the organic metal gas, Pd(OCOCH$_3$)$_2$ gas or C$_{10}$H$_{14}$O$_4$Pd gas is used and a Pd film is formed on the wiring base layer by the ion beam assisted CVD.

According to a second aspect of the present invention, in a method of restoring wiring, after a defective portion of a wiring layer produced on a base layer in a completed semiconductor device is selectively removed, a metal film comprising a predetermined metal element is formed on a portion of the base layer in which the defective portion of the wiring layer is removed, by ion beam assisted CVD, more specifically, by selectively irradiating the portion of the base layer with a focused ion beam while blowing an organic metal gas containing the predetermined metal element onto the region irradiated with the ion beam. Thereafter, a low-resistance metal layer is formed on the metal film by electroless plating. Therefore, the already produced wiring layer in the completed semiconductor device is easily restored without a photolithographic process using a resist.

According to a third aspect of the present invention, in a method of changing a wiring pattern of a wiring layer already produced on a base layer in a completed semiconductor device, a metal film comprising a predetermined metal element is formed on the base layer by ion beam assisted CVD, more specifically, by selectively irradiating a desired region of the base layer with a focused ion beam while blowing an organic metal gas containing the predetermined metal element onto the region irradiated with the ion beam and, thereafter, a low-resistance metal layer is formed on the metal film by electroless plating, whereby the wiring pattern of the already produced wiring layer is changed to a wiring pattern comprising both the low-resistance metal layer and the already produced wiring layer. Therefore, the wiring pattern of the already provided wiring layer in the completed semiconductor device or the like is easily changed without photolithographic processing using a resist.

According to a fourth aspect of the present invention, in the above-described wiring pattern changing method, before the metal film is formed by ion beam assisted CVD, an unnecessary portion of the already produced wiring layer in the electronic device is selectively removed.

DETAILED DESCRIPTION OF THE PREFERRED EMBODIMENTS

Embodiment 1

Figure 1:
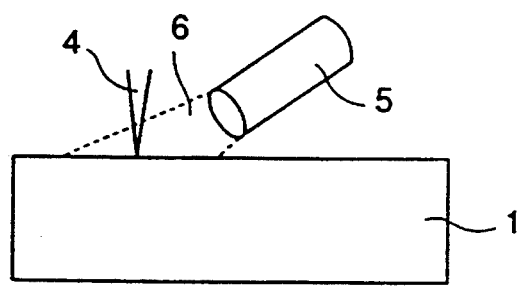
FIGS. 1(a)-1(d) are views for explaining a wiring forming process in manufacturing a semiconductor device according to a first embodiment of the present invention.
Figure 1:
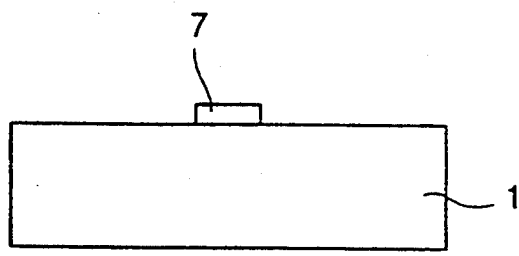
Figure 1:
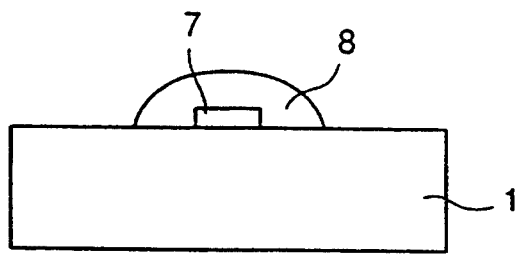
Figure 1:
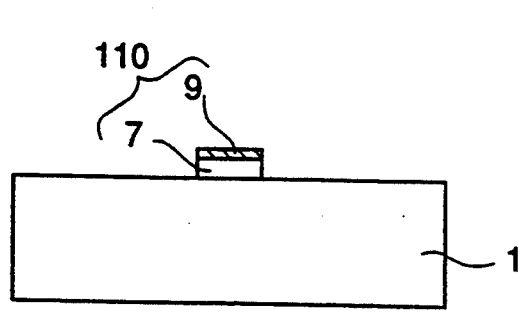

FIGS. 1(a)-1(d) are schematic views showing a method of forming wiring which is employed in a manufacturing a semiconductor device, according to a first embodiment of the present invention. In FIG. 1(d), a semiconductor substrate 1 includes a wiring 110 with a predetermined pattern. The semiconductor substrate 1 comprises a semiconductor material, such as Si, GaAs, InP, or the like. The wiring 110 comprises a focused ion beam (FIB) assisted metal film 7 (referred to as a metal film hereinafter) with a predetermined pattern which is formed on the semiconductor substrate by FIB assisted CVD, and a plated metal layer 9 (referred to as a low-resistance metal layer hereinafter) formed on the metal film by electroless plating. The low-resistance metal layer 9 is formed of a metal, such as Ni, Au, or Cu.

The semiconductor substrate 1 is irradiated with ion beams 4, such as $Ga^+$, $As^+$, $Sc^+$, $Ar^+$, along a predetermined scanning pattern. An organic metal gas nozzle 5 blows an organic metal gas 6 containing Pt, Pd or Au upon a region irradiated with the ion beams. The nozzle 5 is positioned in the vicinity of the surface of the semiconductor substrate 1. Electroless plating solution 8 is dropped onto the semiconductor substrate 1 to cover the surface of the metal film 7. Metal elements contained in the organic metal gas 6 are not limited to the above elements in principle, and it is good enough if the metal layer can be formed on the metal film containing the metal elements by electroless plating. In actual process, however, it is thought that an element whose oxidation-reduction potential to referenced to a standard hydrogen electrode is +0.8 V or more, i.e., a noble metal element, is appropriate. Additionally, the oxidation-reduction potentials referenced to the standard hydrogen electrode of PT, Pd, Au are 1.18 V, 0.951 V, 1.692 V, respectively.

Figure 2:
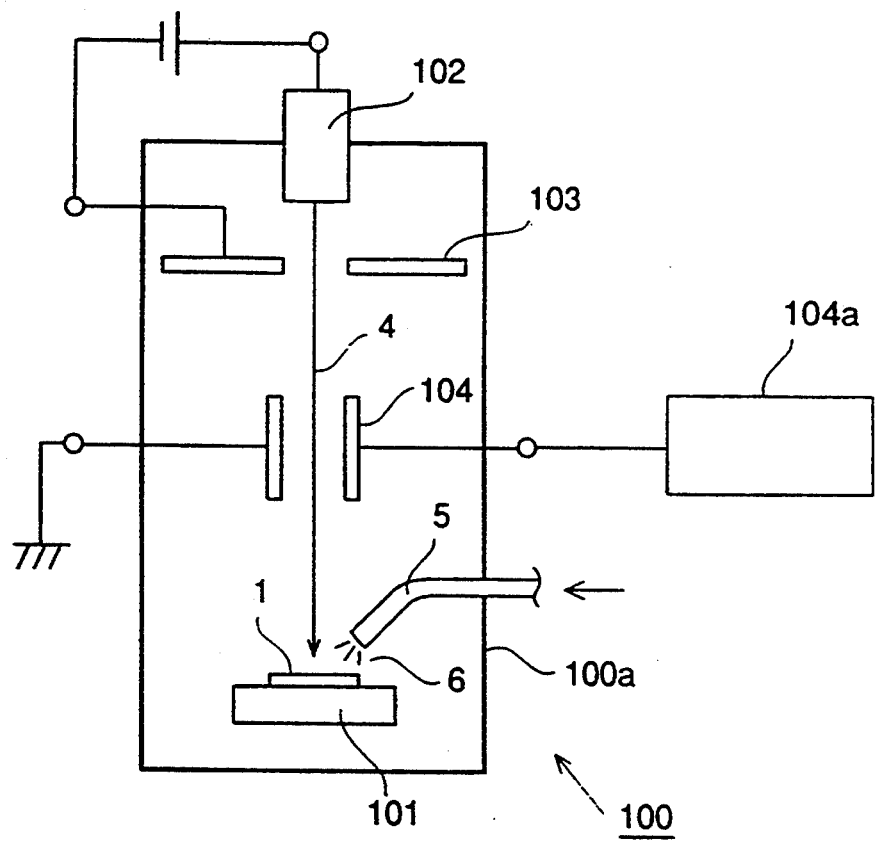
FIG. 2 is a schematic view showing a structure of an FIB assisted CVD apparatus used in the wiring forming process.

FIG. 2 is a schematic view showing a structure of an FIB assisted CVD apparatus used in the wiring forming method according to this first embodiment of the invention. In FIG. 2, an FIB assisted CVD apparatus 100 comprises a processing chamber 100a. The chamber 100a contains a substrate table 101 on which a semiconductor substrate 1 is place. The organic metal gas nozzle 5 is arranged above and close to the substrate table 101. In addition, an ion source 102 is arranged above the substrate table 101, and an accelerating electrodes 103 for accelerating ions from the ion source 102 are located under the ion source. Beam scanning electrodes 104 for scanning ion beams 4 are located along a straight line connecting the substrate table 101 and the ion source 102. The beam scanning electrodes 104 are connected to ion beam scanning means 104a for scanning the ion beams 4 along a predetermined pattern.

The manufacturing method will be described.

As shown in FIG. 1(a), the surface of the semiconductor substrate 1 positioned on the substrate table 101 in the FIB assisted CVD apparatus 100 is irradiated with the focused ion beams 4 produced by accelerating and polarizing ions such as $Ga^+$, $As^+$, $Sc^+$ or $Ar^+$, from the ion source 102 in an electric field while scanning the ion beams along a desired pattern. At the same time, the organic metal gas 6, such as palladium acetate $(Pd(OCOCH_3)_2)$ gas or palladium acetylacetonato $(C_{10}H_{14}O_4 Pd)$ gas, is blown onto the region irradiated with the ion beams.

Thus, as shown in FIG. 1(b), the Pd film 7 having the desired pattern is formed on the main surface of the semiconductor substrate 1 by ion beam assisted CVD. Although the organic metal gas contains Pd in this embodiment of the invention, trimethylene metil cyclopentadienyl platinum $(CH_3(CH)_5HPtCH_2CH_2CH_2)$ gas containing platinum or dimethyl gold hexafluoroacetyl acetonate $(C_7H_7F_6O_2Au)$ gas containing gold may be employed. In this case, the FIB assisted CVD metal film may be formed of Pt or Au.

Next, as shown in FIG. 1(c), an electroless plating solution 8 containing Ni, Au, Cu, or the like is applied to the semiconductor substrate 1 so as to cover the metal film 7 formed by FIB assisted CVD. Thereafter, as shown in FIG. 1(d), the low-resistance metal layer 9 comprising Ni, Au, Cu, or the like is formed on the metal film 7 by electroless plating.

Although the electroless plating solution is applied only to the metal film 7 on the semiconductor substrate 1 during the above-described electroless plating process, the whole of the semiconductor substrate 1 may be soaked in the electroless plating solution.

Thereafter, the plating solution is removed by blowing wash water onto the semiconductor substrate 1. Thus, the low-resistance wiring 110 with the desired pattern is formed on the semiconductor substrate 1 (FIG. 1(d)).

According to the above-described first embodiment of the invention, the metal film 7 with the desired pattern is formed on the semiconductor substrate 1 by ion beam assisted CVD, more specifically, by irradiating the surface of the semiconductor substrate 1 with the focused ion beams 4 while blowing the organic metal gas 6 containing Pt, Pd or Au onto a region irradiated with the ion beams and, thereafter, the low-resistance wiring 110 is formed by depositing the low-resistance metal layer 9 on the metal film 7 by electroless plating. Thus, the low-resistance metal wiring 110 can be produced without photolithographic processing using a resist at all and without sputtering deposition or selective etching of the metal film. Consequently, manufacturing costs of the semiconductor device can be significantly reduced. Further, a wiring with low loss is provided in the semiconductor device.

In addition, although the method of forming wiring on a semiconductor substrate is shown in the above-described embodiment of the invention, the method of the present invention may be applied to formation of wiring on a substrate other than a semiconductor substrate.

Furthermore, although a method of forming a low-resistance metal wiring on a semiconductor substrate by FIB assisted CVD and electroless plating is described as the first embodiment of the invention, this method of forming the low-resistance metal wiring may be used when wiring in a completed semiconductor apparatus (electronic device) is restored or changed.

Embodiment 2

FIGS. 3(a)-3(d) are views for explaining a method of restoring wiring according to a second embodiment of the present invention. A semiconductor substrate 121 is included in a completed semiconductor apparatus (not shown). A wiring layer 122 is disposed on the semiconductor substrate 121. The wiring layer 122 has a defective portion 122a. A metal film 122b is formed by FIB assisted CVD at a region where the wiring is to be restored. A low-resistance metal layer 122c is formed by electroless plating at that region.

The method of restoring the wiring pattern will be described.

Figure 3:
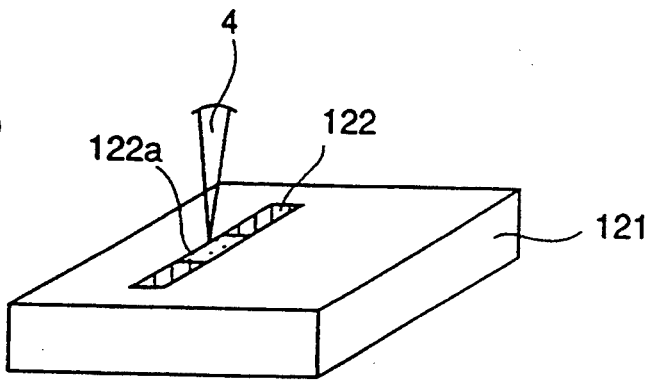
FIGS. 3(a)-3(d) are views for explaining a wiring restoring method according to a second embodiment of the present invention.
Figure 3:
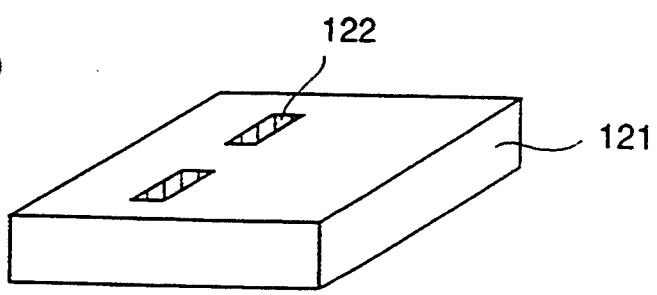
Figure 3:
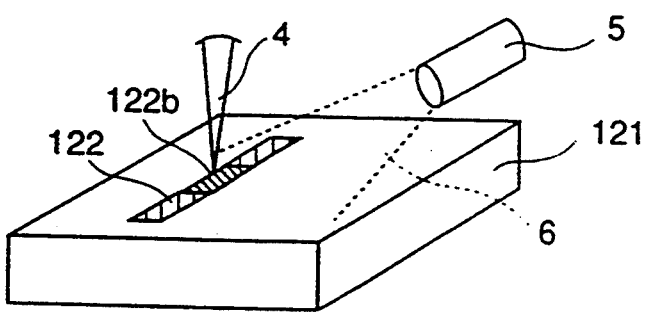
Figure 3:
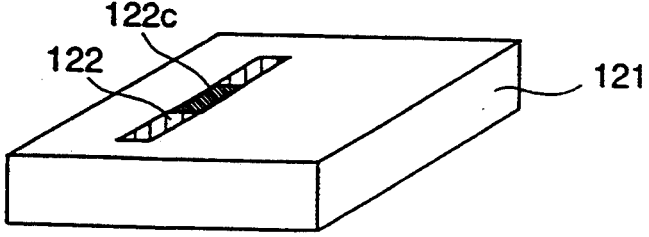

First, as shown in FIGS. 3(a) and 3(b), a completed semiconductor device is arranged in the FIB assisted CVD apparatus 100 and the defective portion 122a in the wiring layer 122 on the semiconductor substrate 121 is irradiated with the ion beams 4 to selectively etch away the defective portion 122a.

Then, as shown in FIG. 3(c), while selectively irradiating the region in which the wiring has been removed with the ion beams 4, the organic metal gas 6 containing Pt, Pd, Au or the like is blown onto the region irradiated with the ion beams, whereby the metal film 122b is formed on that region by ion beam assisted CVD.

Then, as shown in FIG. 3(d), the electroless plating solution 8 is applied to the semiconductor substrate 1 so as to cover the metal film 122b formed by FIB assisted CVD, and the low-resistance metal layer 122c of Ni, Cu, Au or the like is grown on the metal film 122b by electroless plating.

Thus, the defective portion 122a in the wiring layer of the completed semiconductor device is replaced with a metal wiring layer which is favorable for wiring. That is, the already provided wiring layer is restored.

As described above, according to this second embodiment of the invention, after the defective portion 122a of the wiring layer 122 in the completed semiconductor device is selectively removed, the metal film 122b is formed at the region in which the wiring has been removed by irradiating that region with focused ion beams while blowing the organic metal gas onto that region irradiated with the ion beams and, thereafter, the low-resistance metal layer 122c is formed on the metal film 122b by electroless plating. Therefore, the already provided wiring in the completed semiconductor device can be easily restored without photolithographic processing using a resist.

Embodiment 3

FIGS. 4(a)-4(d) are views for explaining a method of changing a wiring pattern according to a third embodiment of the invention. A semiconductor substrate 131 is included in a completed semiconductor device (not shown). A wiring layer 132 whose wiring pattern is to be changed is disposed on the semiconductor substrate 131. A region 132a will be discarded when the wiring pattern of the wiring layer 32 is changed. A metal film 132b is formed by FIB assisted CVD on a wiring portion in which the wiring is changed, i.e., which has been added to the already provided wiring layer 132. A low-resistance metal layer 132c is formed on the CVD metal film 132b. A wiring layer 130 is formed after the wiring pattern is changed.

The method of changing the wiring pattern will be described.

Figure 4:
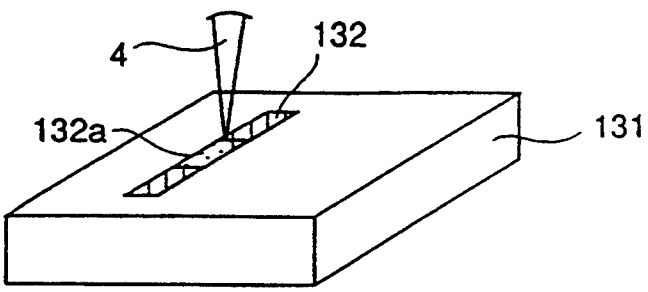
FIGS. 4(a)-4(d) are views for explaining a wiring pattern changing method according to a third embodiment of the present invention.
Figure 4:
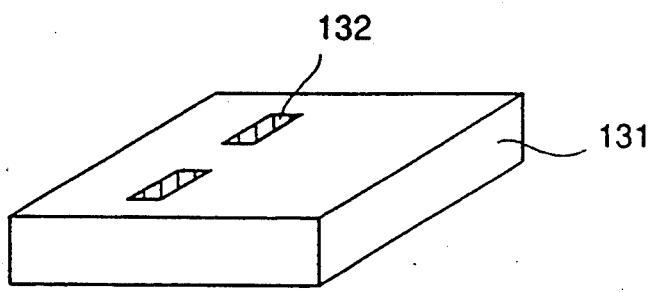
Figure 4:
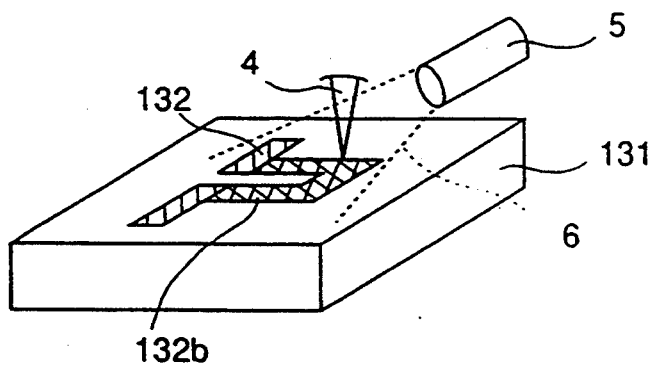
Figure 4:
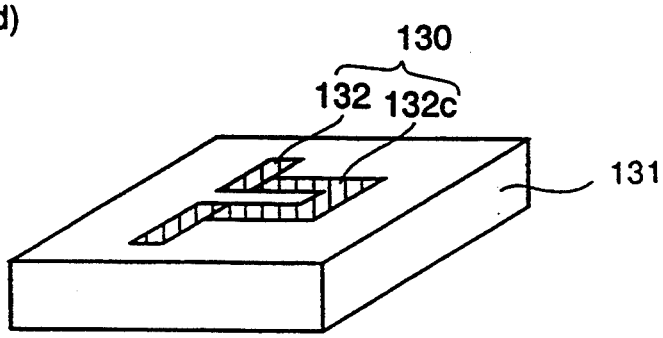
Figure 5A:
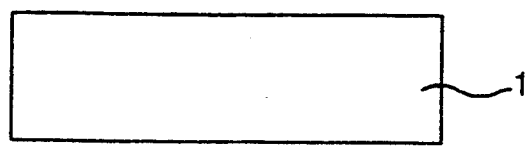
FIGS. 5(a)-5(e) are views for explaining an example of the wiring forming method used in the conventional method of manufacturing a semiconductor device.
Figure 5B:
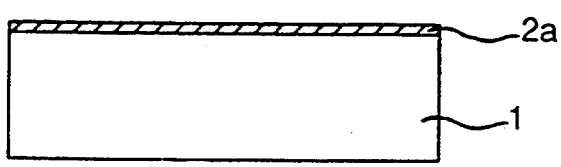
Figure 5C:
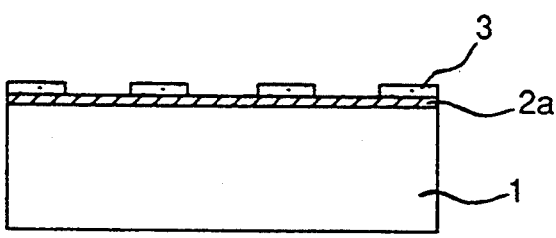
Figure 5D:
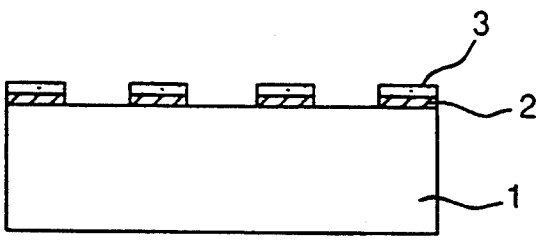
Figure 5E:
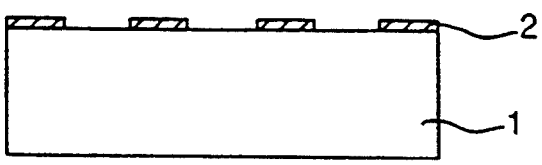
Figure 6A:
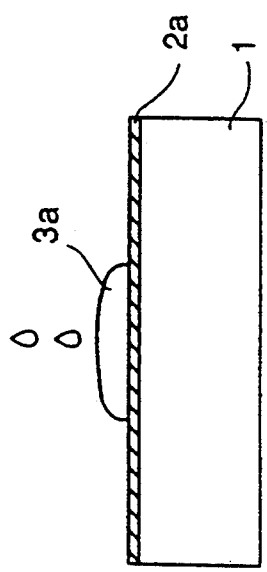
FIGS. 6(a)-6(f) are views for explaining photolithographic processing in the conventional wiring forming method.
Figure 6B:
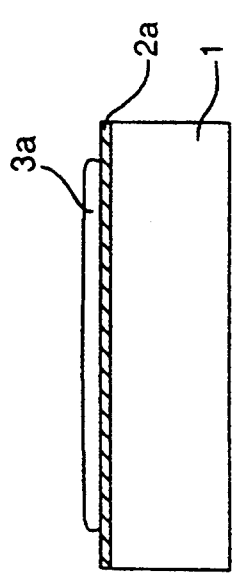
Figure 6C:
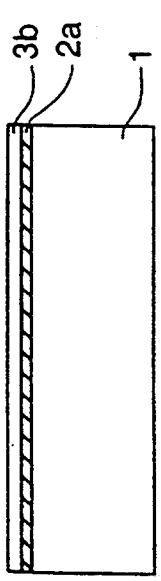
Figure 6D:
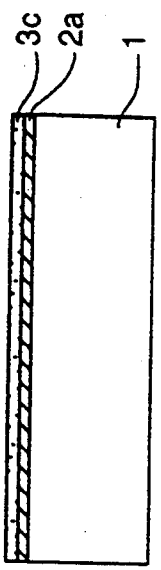
Figure 6E:
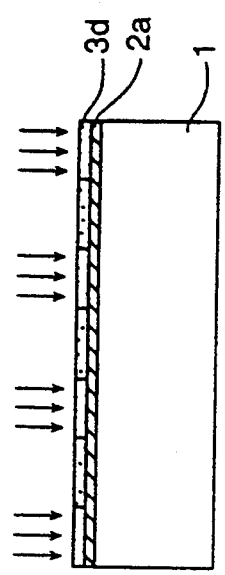
Figure 6F:
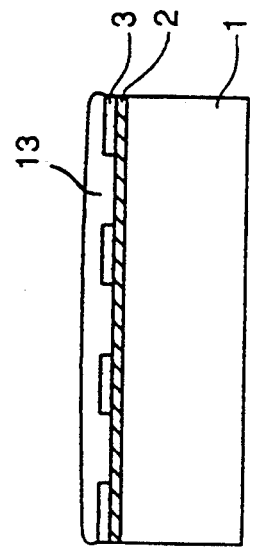
Figure 7:
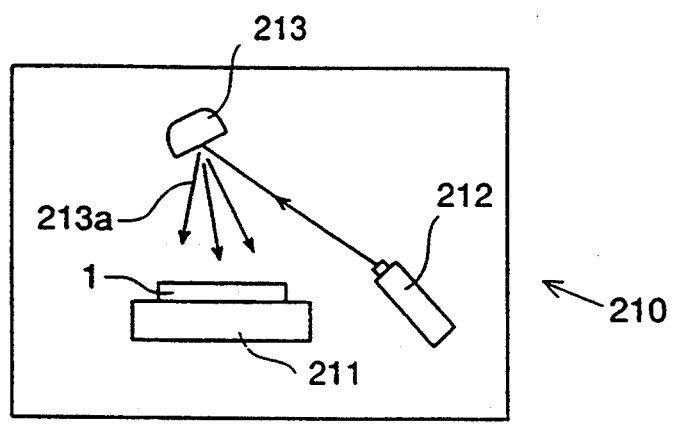
FIG. 7 is a schematic view showing a structure of a sputtering apparatus used in metal film forming in the conventional wiring forming method.
Figure 8A:
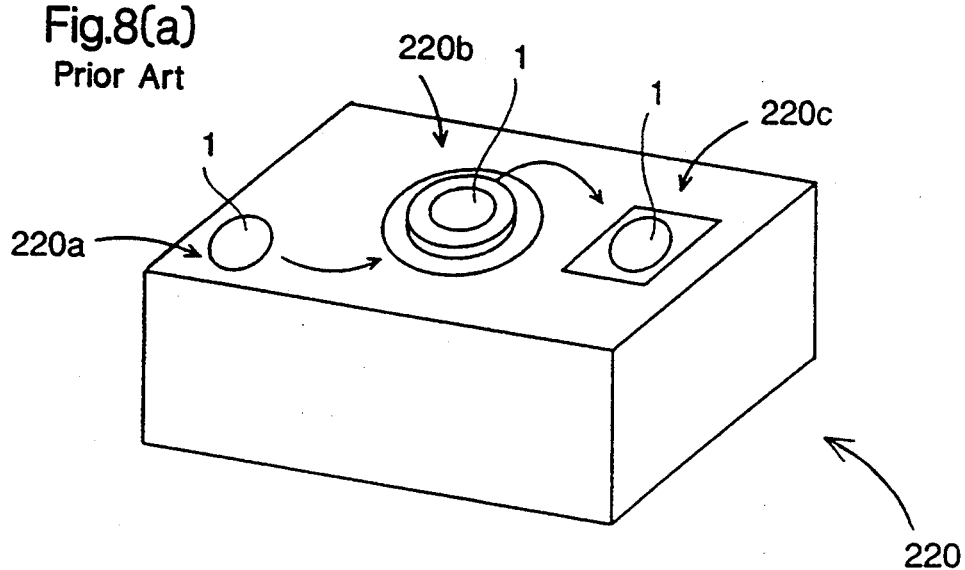
FIGS. 8(a)-8(c) are schematic views showing a structure of a resist applying apparatus used in resist applying in the conventional wiring forming method.
Figure 8B:
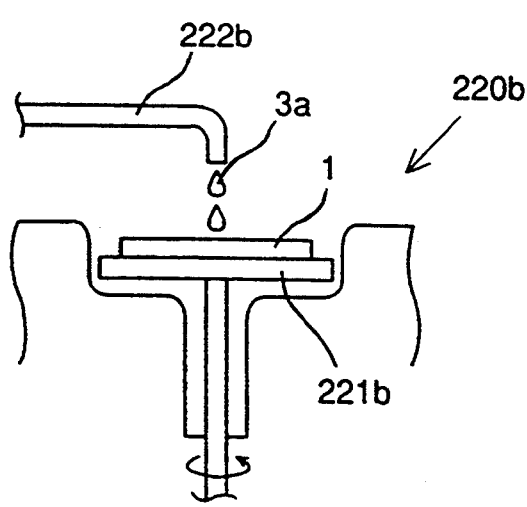
Figure 8C:
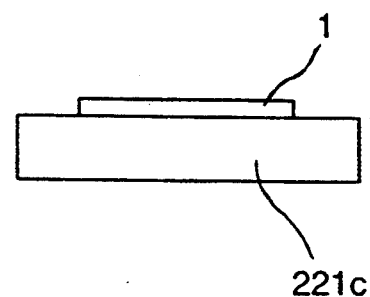
Figure 9:
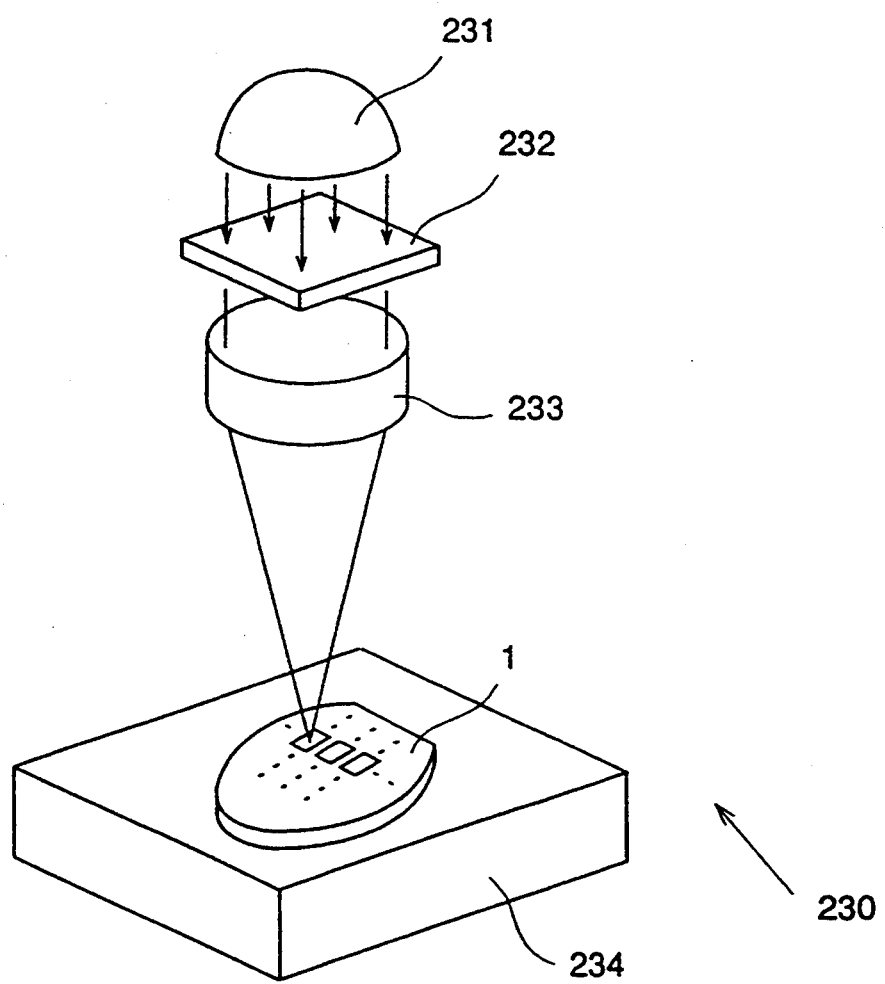
FIG. 9 is a schematic view showing a structure of a resist exposing apparatus used in resist exposing in the conventional wiring forming method.
Figure 10:
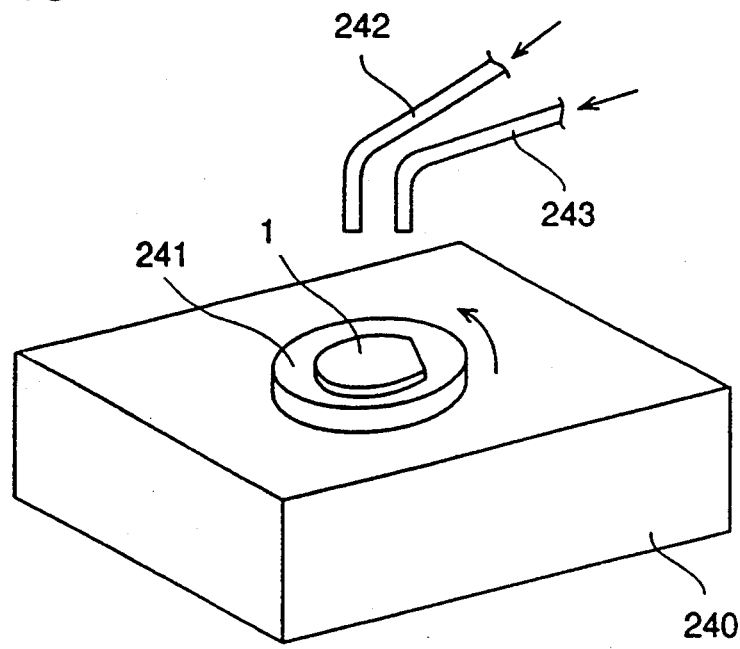
FIG. 10 is a schematic view showing a structure of a resist developing apparatus used in resist developing in the conventional wiring forming method.
Figure 11:
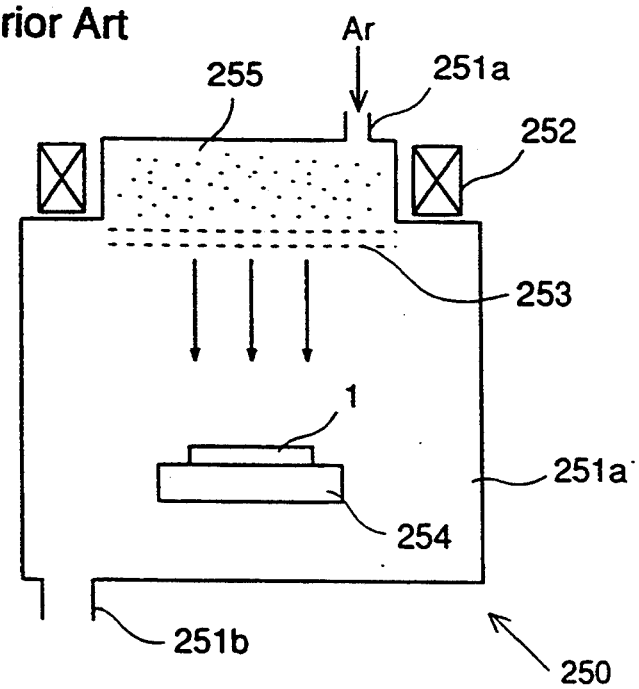
FIG. 11 is a schematic view showing a structure of an ion milling apparatus used in patterning a metal film in the conventional wiring forming method.
Figure 12:
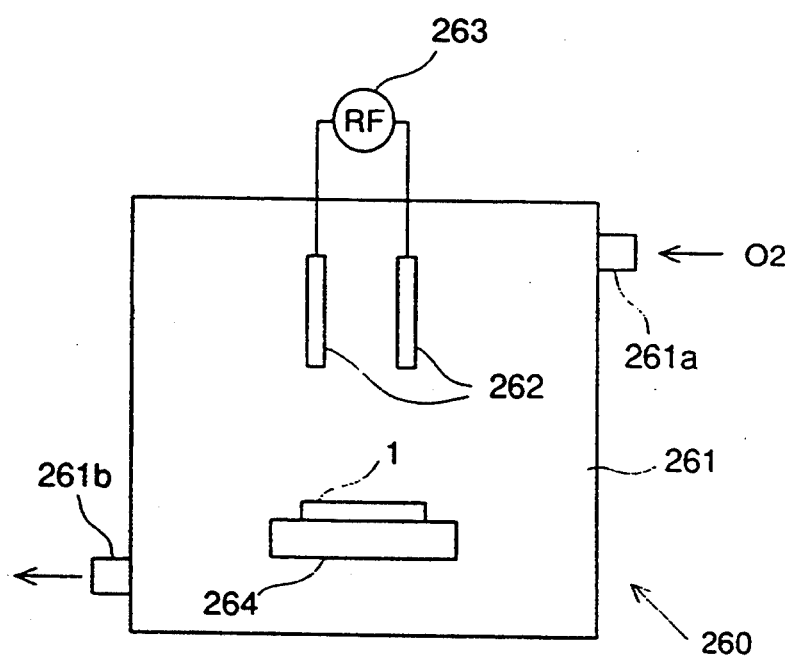
FIG. 12 is a schematic view showing a structure of an oxygen plasma ashing apparatus used in resist mask removing in the conventional wiring forming method.

First, as in the above-described second embodiment of the present invention, in the steps of FIGS. 4(a) and 4(b), the completed semiconductor device is disposed in the FIB assisted CVD apparatus 100 and the unused portion 132a of the already provided wiring 132 on the semiconductor substrate 131 is selectively etched away with the ion beams 4.

Then, as shown in FIG. 4(c), the metal film 132b with a predetermined pattern is formed on the semiconductor substrate 1 by ion beam assisted CVD, more specifically, by irradiating a predetermined region of the semiconductor substrate 131 with ion beams 4 while blowing the organic metal gas 6 onto the region irradiated with the ion beams.

Then, as shown in FIG. 4(d), the electroless plating solution 8 is applied to the semiconductor substrate 131 so as to cover the metal film 132b formed by FIB assisted CVD and, thereafter, the low-resistance metal layer 132c is formed on the metal film 132b by electroless plating, whereby the new wiring layer 130 is formed.

Thus, the wiring pattern of the already provided wiring layer 132 in the completed semiconductor device can be changed to the wiring pattern of the new wiring layer 130.

According to the above-described embodiment of the invention, after the unused portion 132a of the already provided wiring layer 132 in the semiconductor device is selectively removed, the metal film 132b is formed on the predetermined region of the semiconductor substrate 131 by ion assisted CVD, more specifically, by irradiating the desired portion of the semiconductor substrate 131 on which the already provided wiring layer 132 exists with the focused ion beams 4 while blowing the organic metal gas onto the region irradiated with the ion beams and, thereafter, the metal film 132b is formed on the predetermined region of the semiconductor substrate 131 by electroless plating, whereby the wiring pattern of the already provided wiring can be changed to the wiring pattern formed by both the low-resistance metal layer and the already provided wiring. As a result, the wiring pattern of the already provided wiring 132 in the completed semiconductor device can be changed without photolithographic processing using a resist.

What is claimed is:

1. A method of manufacturing a semiconductor device comprising:

forming a metal film comprising a metal element on a wiring base layer by ion beam assisted chemical vapor deposition including selectively irradiating a region of the wiring base layer with a focused ion beam while blowing an organic metal gas containing the metal element onto the region irradiated by the ion beam; and forming a low-resistance metal layer on the metal film by electroless plating.

2. The method of claim 1 including forming a Pd film on the wiring base layer using an organic metal gas selected from $Pd(OCOCH_3)_2$ and $C_{10}H_{14}O_4Pd$.

3. The method of claim 1 including forming one of a Pt film and an Au film on the wiring base layer using an organic metal gas selected from $CH_3(CH)_5PtCH_2CH_2CH_2$ and $C_7H_7F_6O_2Au$.

4. The method of claim 1 including forming the low-resistance metal layer by electroless plating one of Ni, Cu, and Au.

5. A method of restoring a wiring layer on a base layer in an electronic device comprising:

selectively removing a defective portion of a wiring layer from a base layer;

forming a metal film comprising a metal element on a portion of the base layer from which the defective portion of the wiring layer has been removed by ion beam assisted chemical vapor deposition, including selectively irradiating the portion of the base layer with a focused ion beam while blowing an organic metal gas containing the metal element onto the region irradiated by the ion beam; and forming a low-resistance metal layer on the metal film by electroless plating.

6. The method of claim 5 including forming a Pd film on the base layer using an organic metal gas selected from $Pd(OCOCH_3)_2$ and $C_{10}H_{14}O_4Pd$.

7. The method of claim 5 including forming one of a Pt film and an Au film on the base layer using an organic metal gas selected from $CH_3(CH)_5PtCH_2CH_2CH_2$ and $C_7H_7F_6O_2Au$.

8. The method of claim 5 including forming the low-resistance metal layer by electroless plating one of Ni, Cu, and Au.

9. A method of changing a wiring pattern of a wiring layer on a base layer in an electronic device comprising:

forming a metal film comprising a metal element on a base layer and connected to a wiring pattern on the base layer by ion beam assisted chemical vapor deposition, including selectively irradiating a region of the base layer with a focused ion beam while blowing an organic metal gas containing the metal element onto the region irradiated by the ion beam; and forming a low-resistance metal layer on the metal film by electroless plating, whereby the wiring pattern is changed to include the low-resistance metal layer.

10. The method of claim 9 including selectively removing an unused portion of the already produced wiring layer before forming the metal film.

11. The method of claim 9 including forming a Pd film on the base layer using an organic metal gas selected from $Pd(OCOCH_3)_2$ and $C_{10}H_{14}O_4Pd$.

12. The method of claim 9 including forming one of a Pt film and an Au film on the base layer using an organic metal gas selected from $CH_3(CH)_5PtCH_2CH_2CH_2$ and $C_7H_7F_6O_{Au}$.

13. The method of claim 9 including forming the low-resistance metal layer by electroless plating one of Ni, Cu, and Au.

* * * * *

UNITED STATES PATENT AND TRADEMARK OFFICE
CERTIFICATE OF CORRECTION

PATENT NO. : 5,429,994
DATED : July 4, 1995
INVENTOR(S) : Takahide Ishikawa

It is certified that error appears in the above-indentified patent and that said Letters Patent is hereby corrected as shown below:

Column 10, Line 46, change "$C_7H_7F_6O_{Au}$" to --$C_7H_7F_6O_2Au$--.

Signed and Sealed this

Twenty-ninth Day of August, 1995

Attest:

BRUCE LEHMAN

Attesting Officer    Commissioner of Patents and Trademarks